(12) United States Patent
Partlo et al.

(10) Patent No.: US 6,765,946 B2
(45) Date of Patent: Jul. 20, 2004

(54) FAN FOR GAS DISCHARGE LASER

(75) Inventors: William N. Partlo, Poway, CA (US); Curtis L. Rettig, Vista, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 10/029,319

(22) Filed: Oct. 17, 2001

(65) Prior Publication Data

US 2002/0094005 A1 Jul. 18, 2002

Related U.S. Application Data

(63) Continuation-in-part of application No. 09/490,835, filed on Jan. 25, 2000, now Pat. No. 6,317,447, and a continuation-in-part of application No. 09/684,629, filed on Oct. 6, 2000, now Pat. No. 6,442,181, and a continuation-in-part of application No. 09/748,316, filed on Dec. 22, 2000, now Pat. No. 6,477,193, and a continuation-in-part of application No. 09/854,097, filed on May 11, 2001.

(51) Int. Cl.[7] ............................. H01S 3/22; H01S 3/223
(52) U.S. Cl. ............................. 372/58; 372/55; 372/57
(58) Field of Search ............................. 372/55, 57–59

(56) References Cited

U.S. PATENT DOCUMENTS

| | | | | |
|---|---|---|---|---|
| 4,686,680 A | * | 8/1987 | Hoag et al. | 372/58 |
| 4,923,364 A | | 5/1990 | Nilsen et al. | |
| 4,975,925 A | | 12/1990 | Derrickson | |
| 5,611,667 A | * | 3/1997 | Nagamori et al. | 416/178 |
| 5,770,933 A | * | 6/1998 | Larson et al. | 318/254 |
| 5,848,089 A | * | 12/1998 | Sarkar et al. | 372/58 |
| 5,870,420 A | * | 2/1999 | Webb | 372/58 |
| 6,026,103 A | * | 2/2000 | Oliver et al. | 372/37 |
| 6,034,984 A | * | 3/2000 | Hofmann et al. | 372/58 |
| 6,321,448 B1 | | 11/2001 | Makino et al. | |

* cited by examiner

Primary Examiner—David Porta
Assistant Examiner—Davienne Monbleau
(74) Attorney, Agent, or Firm—William Cray

(57) ABSTRACT

An electric discharge laser apparatus having a laser chamber containing a laser gas and two longitudinal electrodes defining a discharge region for producing electrical discharges and a tangential fan for circulating the laser gas and having blade members configured to minimize adverse effects of reflections of electric discharge generated shock waves back to the discharge region simultaneously with a subsequent discharge.

18 Claims, 7 Drawing Sheets

CHAMBER A

CHAMBER B

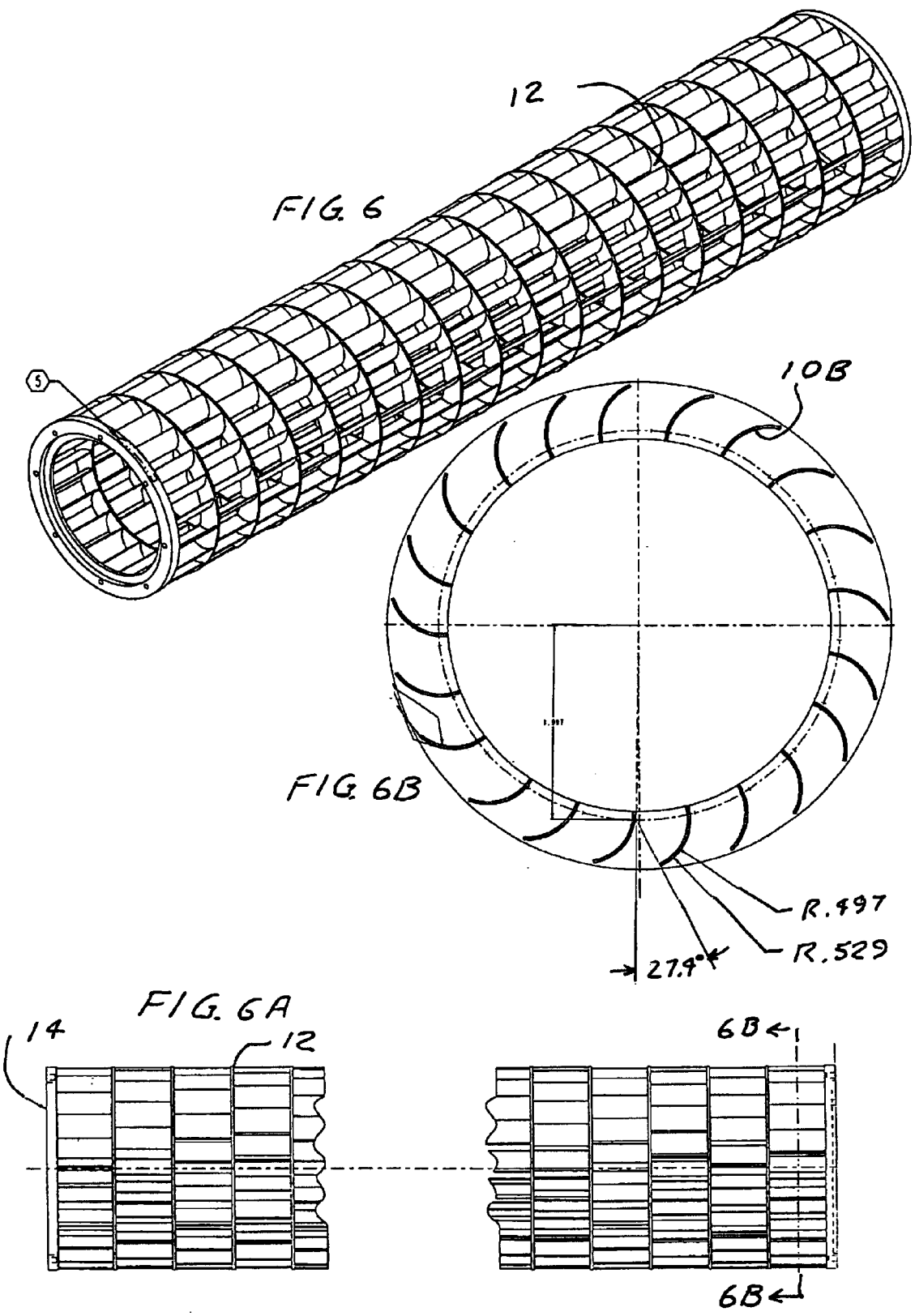

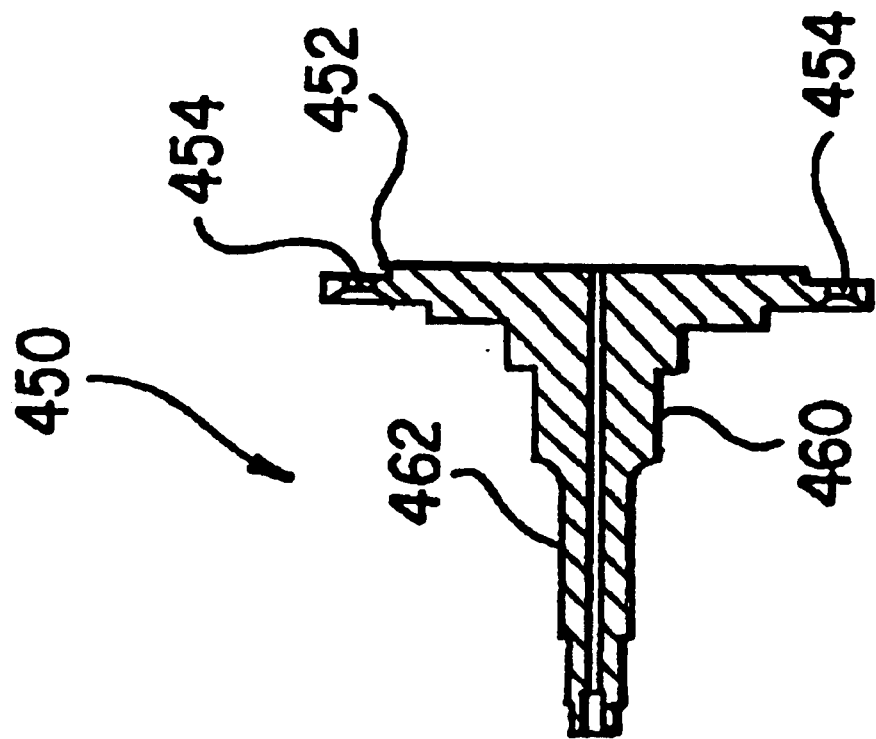
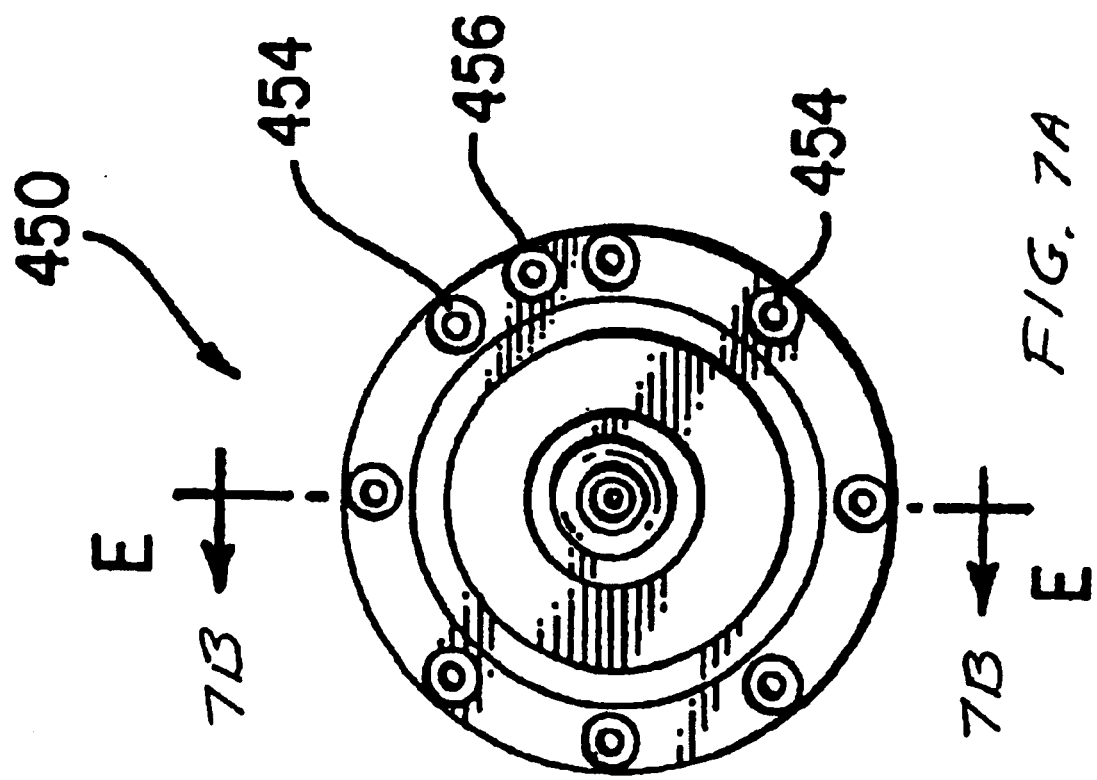

FAN FOR GAS DISCHARGE LASER

This invention is a continuation-in-part application of Ser. No. 09/490,835, filed Jan. 25, 2000, now U.S. Pat. No. 6,317,447; Ser. No. 09/684,629, filed Oct. 6, 2000, now U.S. Pat. No. 6,442,181; Ser. No. 09/748,316, filed Dec. 22, 2000, now U.S. Pat. No. 6,477,193; and Ser. No. 09/854,097, filed May 11, 2001 all of which are incorporated herein by reference. This invention relates to gas discharge lasers and in particular to gas discharge lasers with tangential fans providing laser gas circulation.

BACKGROUND OF THE INVENTION

Gas discharge lasers such as excimer lasers are well known light sources useful for integrated circuit lithography. These lasers typically comprise two elongated electrodes (for example, about 50 cm in length) separated by about ¾ inch. A high voltage pulse power source provides high voltage electrical pulses to produce discharges between the electrodes to create a gain region in a circulating laser gas. A tangential fan is provided to produce sufficient laser gas flow to remove from the discharge region substantially all debris produced by each discharge prior to the next succeeding discharge. The following four patents assigned to Applicants' employer describe prior art tangential fan designs: U.S. Pat. Nos. 6,034,984, 6,061,376, 6,195,378 B1 and 6,144,686. These patents are incorporated herein by reference.

FIGS. 1a and 1b are cross-sectional end and side views respectively showing the inner structure of a laser chamber 100 in a conventional excimer laser (see Akins et al., U.S. Pat. No. 4,959,840, issued Sep. 25, 1990, and incorporated herein by reference in its entirety). A laser enclosure 102 provides isolation between a laser chamber interior 105 and the exterior 110. Typically enclosure 102 is formed by a pair of half enclosure members 112 and 114 (see FIG. 1a), which are coupled together and sealed using an o-ring seal 116, extending along a perimeter of enclosure 102. Laser chamber interior 105 is filled to a predetermined pressure with a lasing gas 108. A pulsed gas discharge is generated in a discharge region 122 by a high voltage pulse applied between a cathode assembly 118 and an anode assembly 120. The pulsed gas discharge typically produces excited argon fluoride, krypton fluoride, or fluorine molecules, which generate laser pulse output energy. The pulse output energy propagates from discharge region 122 through an optical output window assembly 162 (see FIG. 1b). Cathode assembly 118 and anode assembly 120, defining discharge region 122, extend parallel to one another along the length of laser chamber 100.

Recirculation of lasing gas 108 is provided by a tangential fan 140, which rotates about an axis 142 and includes a plurality of substantially parallel straight blade members 144 extending along the length of laser chamber 100 between hub members 146. A typical rotation rate for current tangential fans is on the order of approximately 3800 revolutions per minute (rpm). As shown by arrows in FIG. 1a, the flow of gas 108 is upward through tangential fan 140 and transversely across discharge region 122 as directed by a vane member 152. Lasing gas 108 that has flowed through discharge region 122 becomes dissociated and heated considerably by the pulsed gas discharge. A gas-to-liquid heat exchanger 158 (not shown in FIG. 1b) extending along the length of laser chamber 100 is positioned in the gas recirculation path to cool the heated gas. Other vane members, e.g. vane members 160, direct the flow of gas 108 through heat exchanger 158 and elsewhere along the gas recirculation path. Recirculation cools and recombines lasing gas 108, thereby allowing repetitively pulsed laser operation at rates in the range of 2,000 to 4,000 Hz.

Since lasing gas 108 is recirculated and reused, it is important to maintain cleanliness and to prevent contamination of the gas environment within laser chamber interior 105, in order to maximize the pulse energy performance, stability, and working life of lasing gas 108.

In excimer lasers of the type referred to in there patents, the electric discharge produces acoustic waves which can reflect back to the discharge region at a time coincident with a succeeding pulse, especially the next succeeding pulse. These returning shock waves can disturb the gain region produced by the succeeding pulse and adversely affect the quantity of the laser pulse produced in the gain region. One of the important improvements provided by the fans described in the above patents was to vary the circumferential position of the blades to reduce cylindrical symmetry of the fan blades.

Thus, in one of the designs a helical blade pattern was provided. In another design, the fan was segmented and the blades in each segment were offset from each other. Designs were also proposed to improve the stiffness of the fan blade structure. These and other improvements were described in these patents to avoid aerodynamic buffeting effects which could reduce bearing life and adversely affect beam quality.

The improvements described in the above patents provided substantial improvements in laser performance including beam quality. However, Applicants have discovered that even after incorporating the above described improvements, laser beam quality can be adversely affected when the laser is operating at several combinations of specific discharge repetition rates and specific fan rotation rates.

What is needed is a better tangential fan.

SUMMARY OF THE INVENTION

The present invention provides an electric discharge laser apparatus having a laser chamber containing a laser gas and two longitudinal electrodes defining a discharge region for producing electrical discharges and a tangential fan for circulating the laser gas and having blade members configured to minimize adverse effects of reflections of electric discharge generated shock waves back to the discharge region simultaneously with a subsequent discharge.

In preferred embodiments, the blades are arranged in segments in a pattern simulating a double helix. In other preferred embodiments, the blades are arranged in segments with the blades in each segment positioned in an asymmetrical pattern. In other preferred embodiments, the blades in each segment are arranged to simulate a double helix and also arranged asymmetrically with respect to blades in other segments.

In another embodiment, the blades are arranged to simulate the double helix pattern and in addition are arranged in an asymmetrical pattern with respect to the blades in the same segment and/or with respect to blades in other segments.

BRIEF DESCRIPTION OF THE DRAWINGS

FIGS. 6, 6A and 6B describe a second preferred fan blade structure.

FIGS. 7A and 7B are drawings of a shaft assembly.

DETAILED DESCRIPTION OF PREFERRED EMBODIMENTS

Preferred embodiments of the present invention can be described by reference to the drawings.

Problems With Prior Art Designs

As indicated in the Background Section of this application, improvements described in the four listed patents provided substantial improvements in performance of gas discharge excimer lasers used for integrated circuit fabrication.

Figure 1A:
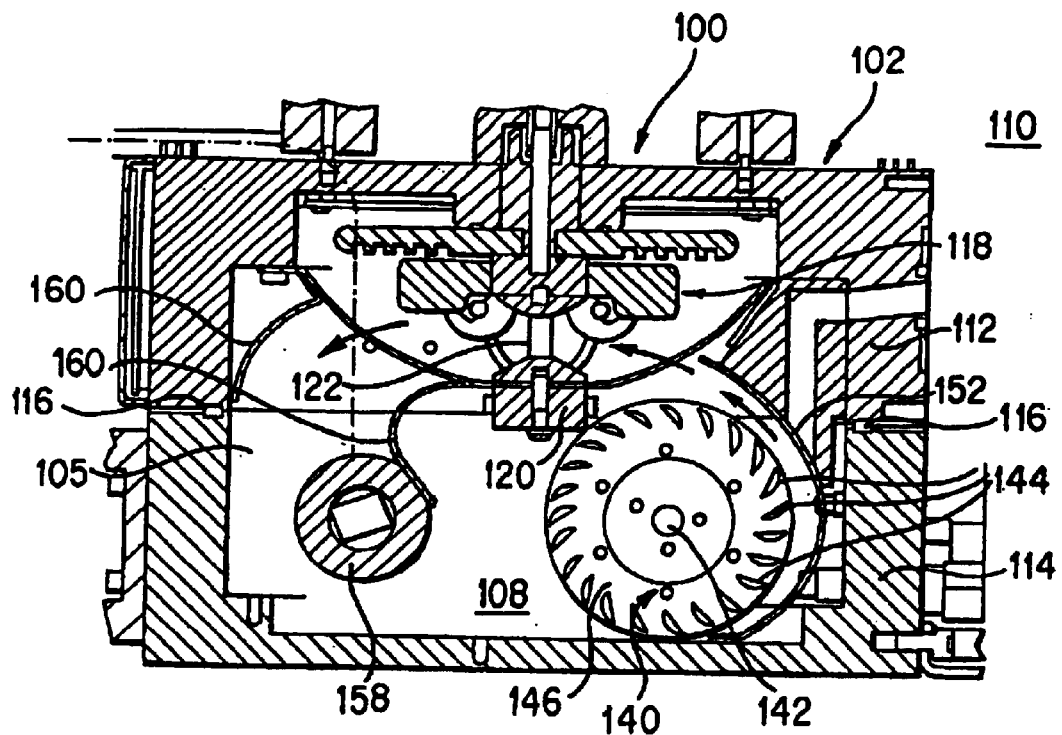
FIGS. 1a and 1b are drawings of a prior art laser chamber.
Figure 1B:
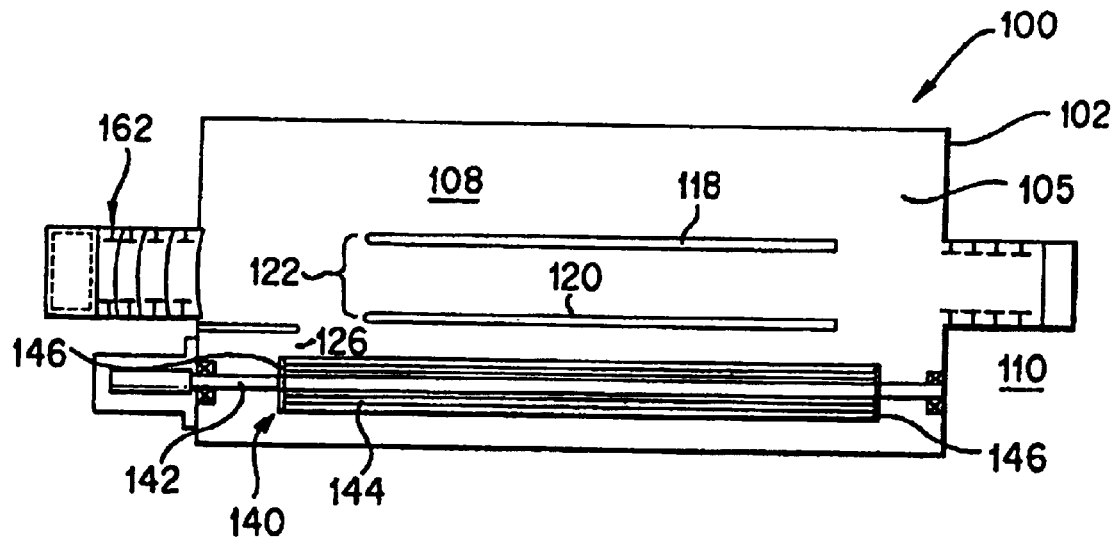
Figure 2:
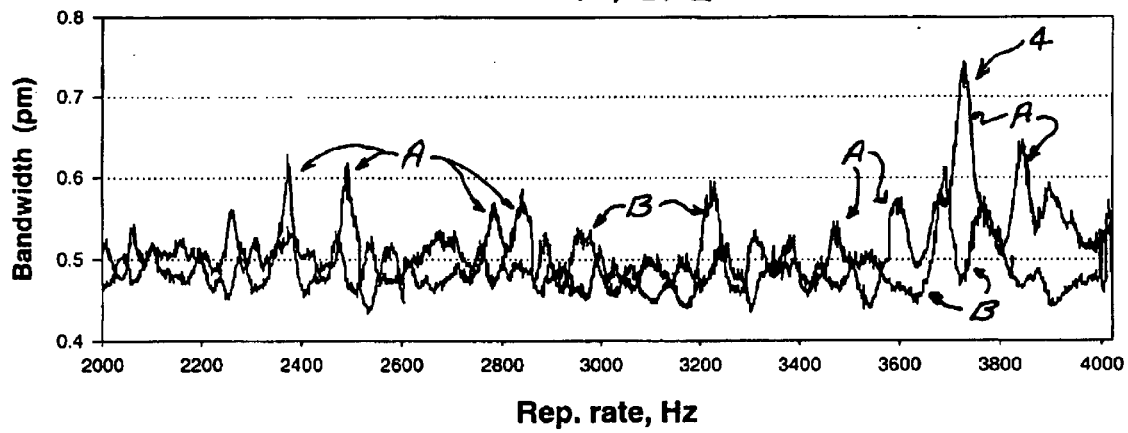
FIG. 2 shows bandwidth plots as a function of repetition rates.
Figure 3A:
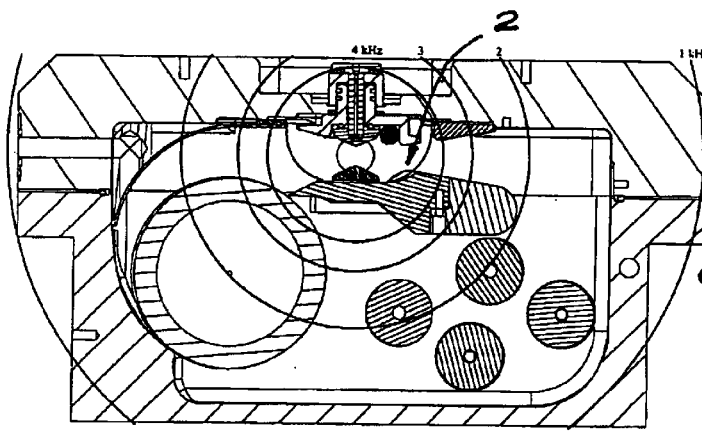
FIGS. 3A and 3B show chamber cross section and shock patterns.
Figure 3B:
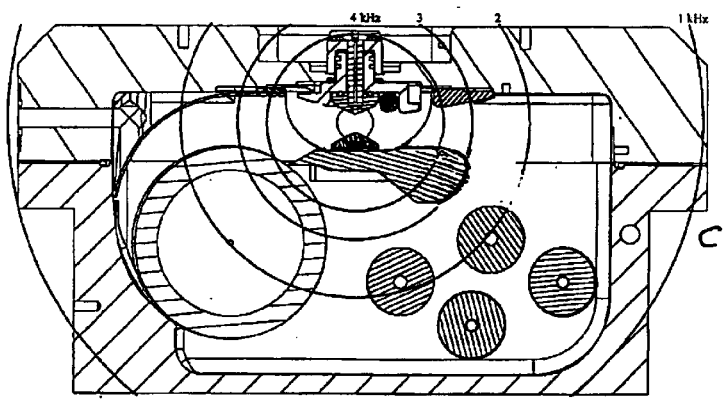

However, these prior art designs did not completely eliminate beam quality problems caused by interactions between the laser discharges and the rotating fan. For example, a fan blade structure in accordance with FIG. 2A of U.S. Pat. No. 6,144,686 patent has been tested by Applicants in several chamber configurations. FIG. 3 is a reproduction of a chart plotting laser bandwidth as a function of discharge repetition and at a fan speed of 3500 rpm for the two chamber configurations shown in FIGS. 3A and 3B. The plotted bandwidth values represent the maximum measured bandwidth in 40 pulse windows. As shown on the chart, at certain specific repetition rates, there are large increases in the bandwidth measurements. Applicants have determined that most of the bandwidth variations as a function of repetition rate are the result of acoustic shock effects due to shock waves produced by a prior pulse reflecting back to and passing through the discharge region during the approximately 40 ns time period of a subsequent pulse.

As described in U.S. Pat. No. 5,978,405, much of these effects have been minimized by lining chamber walls with reflectors which reflect the shock waves away from the discharge region or with baffles on other structural features which break up the shock waves and dispense them.

At repetition rates of less than 1000 Hz, these shock waves are not a substantial problem because all structural features in the chamber are close enough to the discharge that a shock wave must make at least two reflections to return to the discharge region simultaneously with a subsequent discharge. At rates in excess of about 1500 Hz, reflection becomes a significant potential problem because the round trip to the chamber walls and back takes a time interval equal to the interval between pulses. At higher rates, the round trip time to other structures and back to the discharge region correspond to time intervals between pulses all as clearly shown by the concentric circles in the FIGS. 3A and 3B cross section drawing. In some cases, close-in feature can produce such strong reflection that two reflections can be a problem. For example, as shown in FIG. 3A, Applicants added a hump shown at 2 to the flow shaping anode support bar in an attempt to improve the gas flow through the discharge region. However, the hump produced double reflections which were a severe problem at repetition rates of about 3,700 Hz. As shown in FIG. 3, this large bandwidth disturbance shown at 4 on FIG. 2 disappeared when the hump was removed as shown in FIG. 3B.

Figure 4A:
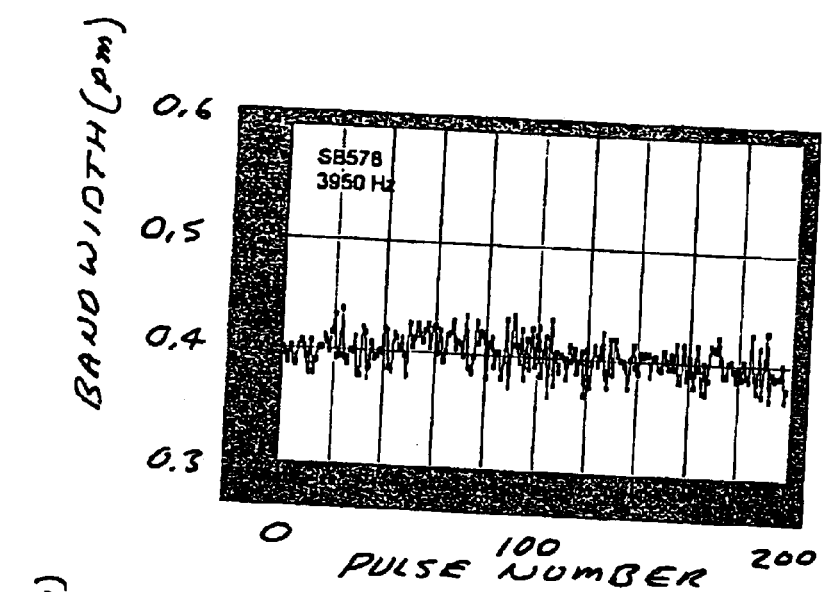
FIGS. 4A, 4B and 4C show bandwidth variation with pulse number.
Figure 4B:
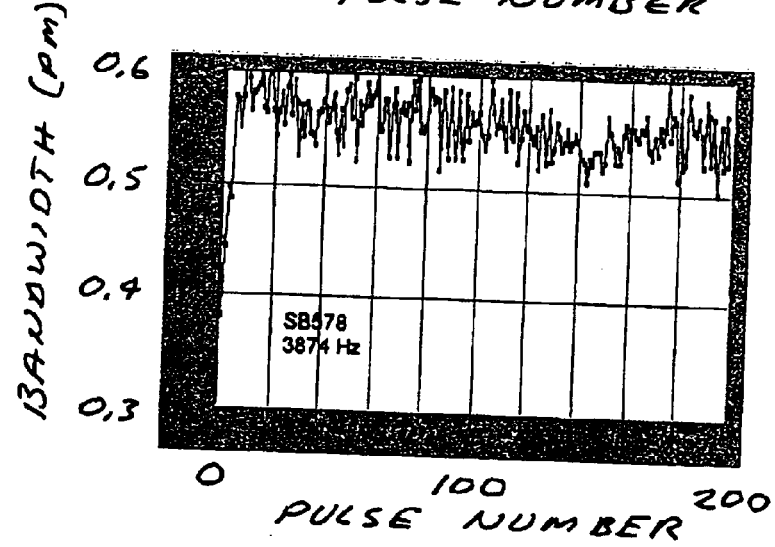
Figure 4C:
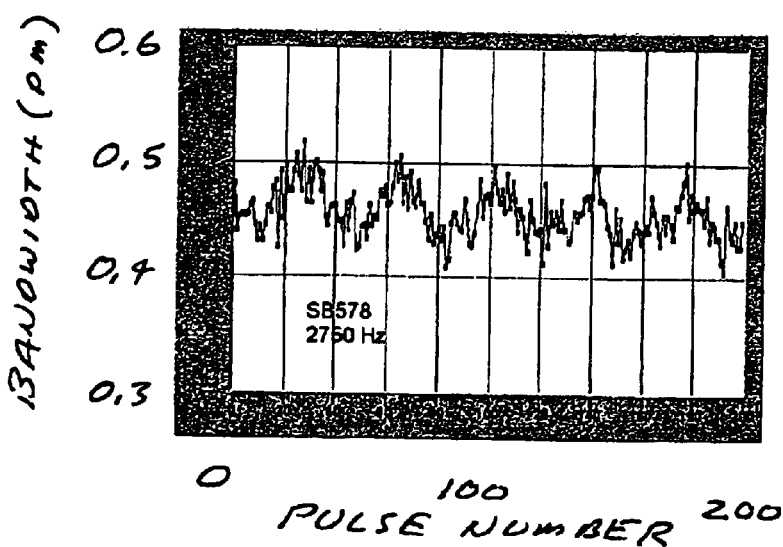

Plots such as the one shown in FIGS. 3 and 4 represent the maximum of the 160 average bandwidth measurements for each window of 160 40-pulse sliding windows of each of three 200-pulse bursts. Three of these average values are plotted for each repetition rate which is represented on the plots. They are almost always very close together and usually appear as a single spot at the scale shown. To investigate the cause of bandwidth fluctuations with repetition rate, Applicants conducted experiments in which bandwidths were measured as a function of time at several fixed repetition rates and blower speed. Three of these plots are shown in FIGS. 4A, B and C. FIG. 4A is a plot of bandwidth versus pulse number at 3,950 Hz repetition rate and blower speed of 3500 rpm where the measured maximum bandwidth was narrow. The FIG. 4B plot represents data taken at 3,874 Hz repetition rate and 3500 rpm blower speed where the measured maximum bandwidth was relatively high at this repetition rate. FIG. 4C was based on data taken at 2,750 Hz repetition rate and 3500 rpm blower speed at another relative high maximum bandwidth region.

At the repetition rate corresponding to narrow maximum bandwidth (i.e., FIG. 4A) the data shows stable narrow bandwidth values throughout the burst from the first pulse to the last pulse. The FIG. 4B chart indicates narrow bandwidth for the first pulse of a burst but increasing in steps of about 0.5 pm per pulse for about the first 3 or 4 pulses and then relatively steady at about 0.15 pm higher than average. This chart is representative of increased bandwidth caused by reflection from a fixed object. The FIG. 4C chart shows a periodic variation in bandwidth with pulse number (or time) with a period of about 39 pulses at 2,750 Hz (or about 14 milliseconds) corresponding to a frequency of about 71 Hz. The periodic variation is affected by both fan speed and repetition rate so it is clear that the variations are caused by an interaction between the rotating blades and the discharges. The exact correlation is not clear. This particular variation correlates approximately with the following relationship:

$$F_{LW}=2F_{blade}-F_{RR}$$

In this case, the repetition rate is 2,750 Hz. The fan speed is 3500 rpm and there are 23 blades; therefore, the blade frequency is 1341.67 Hz, and the above relationship would predict a linewidth oscillation at $$F_{LW}=2(1341.67 \text{ Hz})-2,750 \text{ Hz}$$

$$F_{LW}=66.66 \text{ Hz},$$

which is close to the frequency of the observed line width oscillations of about 71 Hz.

Solution to Fan-Discharge Caused Bandwidth Purturbations

In order to minimize the effects of acoustic reflections from the fan blades, Applicants have modified the fan blade structure design so that acoustic energy in shock waves are dispersed by the blades rather than being reflected back to the discharge region at specific combinations of repetition rate and blade frequency.

First Preferred Blade Design

A first preferred fan blade structure design is shown in FIGS. 5 and 5A–D. This design is similar in concept to the fan with helical blades described in U.S. Pat. No. 6,034,984. The helical blade structure shown in that patent has not been utilized extensively by Applicants because Applicants determined that the helical design would create a longitudinal pressure gradient in the chamber which was not desirable.

Figure 5:
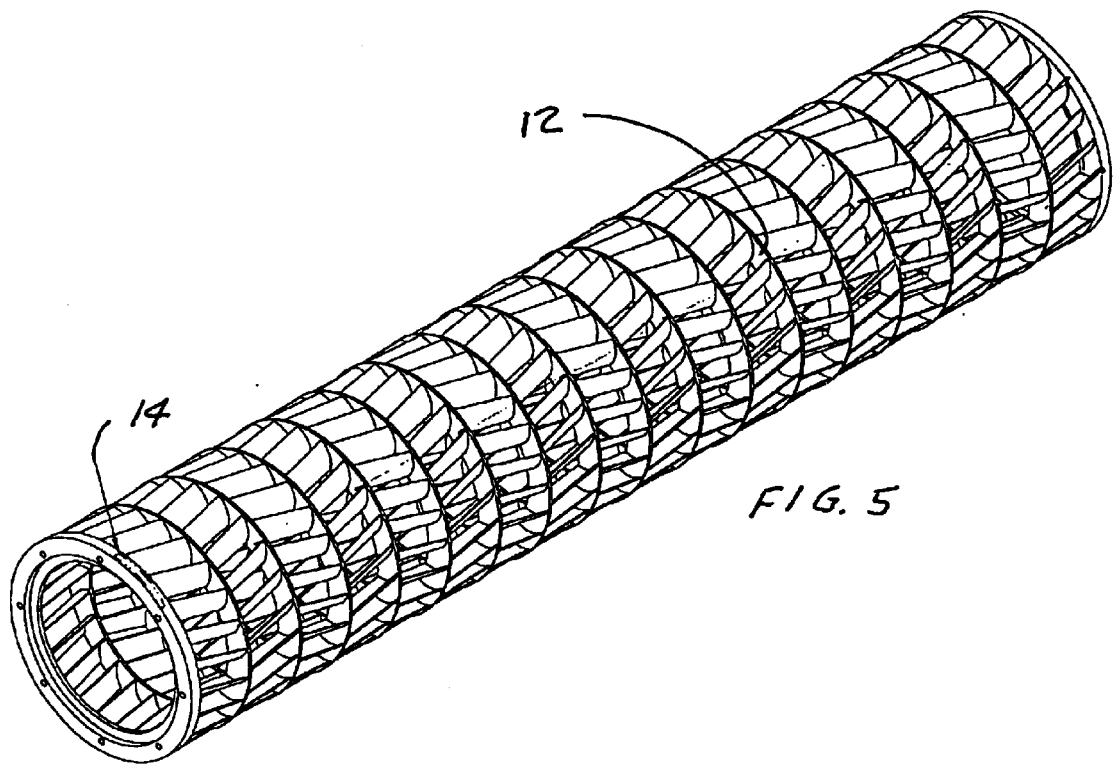
FIGS. 5, 5A, 5B, 5C and 5D describe a first preferred fan blade structure.
Figure 5A:
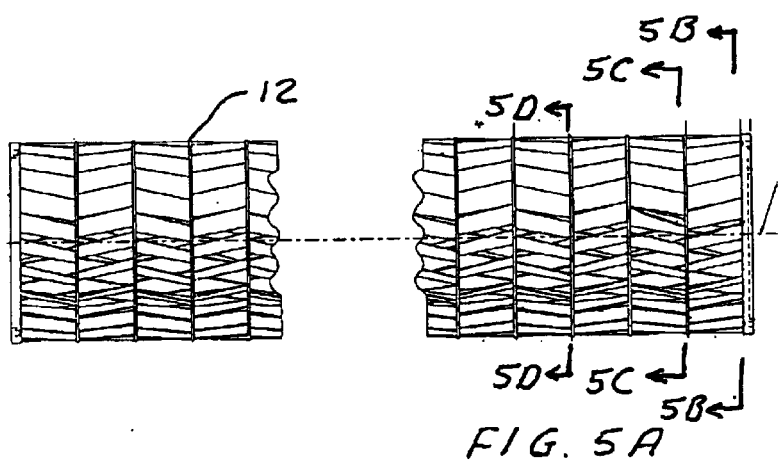
Figure 5B:
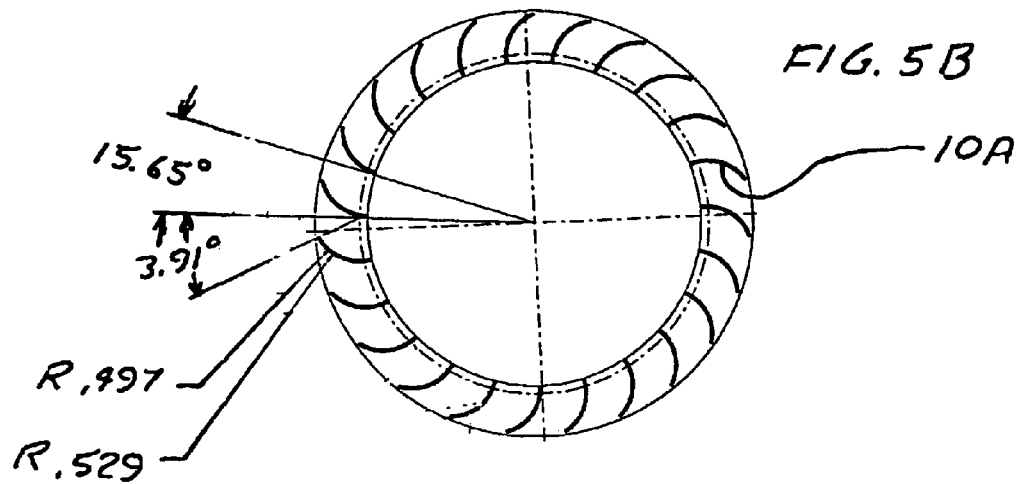
Figure 5C:
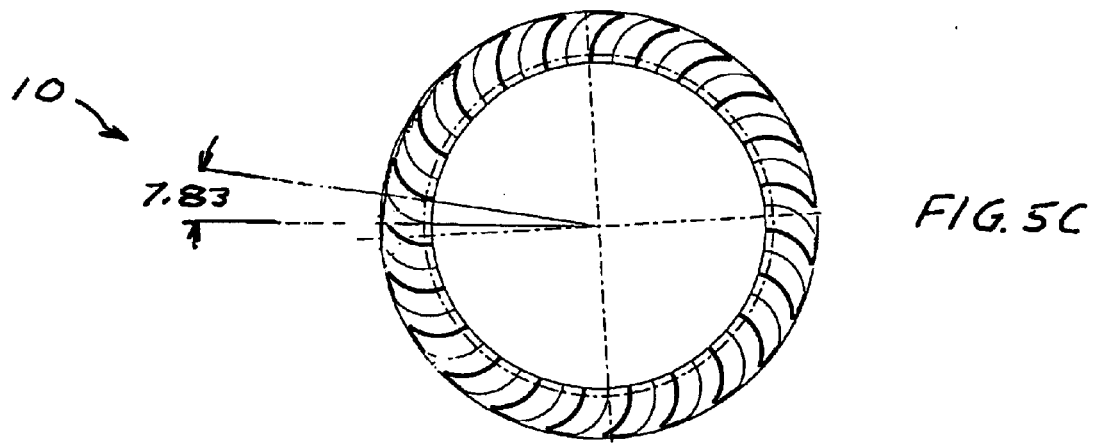
Figure 5D:
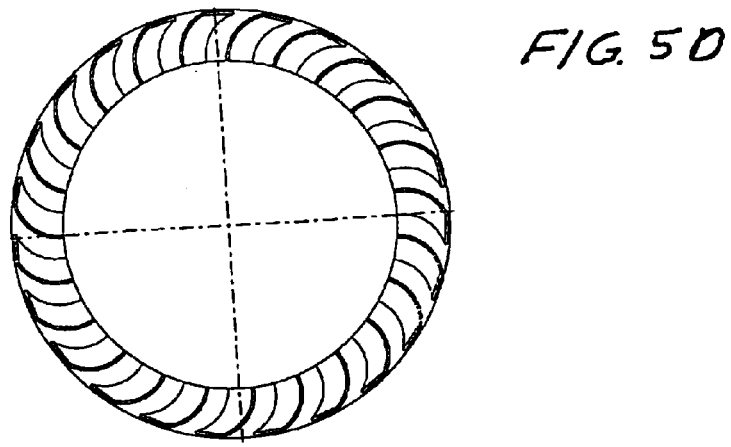

The design in FIG. 5 is a double helix design. FIG. 5A is a side view and FIGS. 5B, C and D are cross section drawings. The blade structure is comprised of 18 segments with the blades in alternate segments angled in opposite directions. This blade structure is machined from a solid aluminum tube. The circumference of the unit is 5.0 inches. The inside diameter of the unit is 3.712 inches. In this embodiment, there are 23 blades spaced uniformly around the circumference at 15.65° as shown in the FIG. 5B cross section drawing. The blades make an angle with respect to the fan unit axis as shown at 10 in FIG. 5C. Each of the individual blades is formed in an arc defined by an inside radius of 0.497 inch and an outside radius of 0.529 inch with both radii having a common straight line origin. A preferred alternate blade member would be fabricated by increasing the inner radius but moving origin (center of rotation) further away from the blade member. With this approach the resulting member is banana shaped with a point at the leading edge with basically the same cross sectional area.

Second Preferred Blade Design

A second preferred blade design is shown in FIGS. 6 and 6A–D. This design is similar to a blade structure design described in the '984 patent. Like the above design described in the preceding section, the blades in this design are separated into 18 segments but in this case the blades in each segment are aligned parallel to the axis of the blade unit. The important new feature incorporated in this design is that the blades in each segment are intentionally positioned asymmetrically around the circumference of the fan blade structure and in addition symmetry among the segments is also intentionally avoided. For example, there are 21 blades 10B in each segment. In a symmetrical configuration as described in the '376 patent, the blades would be positioned symmetrically on 17.143 degree centers. Instead in this case the blade separation varies approximately randomly between about 15 degrees and 19 degrees. From the blades in one segment to the blades in the next segment the blade off-set varies approximately randomly from about 7 degrees to about 12 degrees.

In this demonstration unit 21 blades were used instead of 23. Applicants have determined that 23 blades are optimum and the 21 blades result in a slight reduction in fan efficiency but substantially eliminate the periodic wavelength variation at resonant frequencies. Preferably, the random blade approach should be used with 23 blades which will bring the efficiency back up to optimum.

Third Preferred Embodiment

A third preferred embodiment would combine the features of the first and second embodiment so that the double helix angled blades would be randomized as in the second embodiment.

Machined Fan Blade Structure

As described in the '984 patent, the preferred method of fabricating a tangential fan assembly involves machining an entire fan assembly as a monolithic unit from a single piece of material. The above described embodiments are machined from a single tube of 6061 aluminum alloy.

Hub members 12 as shown in FIGS. 5A and 6A provide structural rigidity to the blade units. Particularly, tangential fan blade structures are machined such that stiffening fillets are formed in the corners connecting the ends of blade members and the annular surfaces of hub members and end flanges 14.

FIGS. 4D and 4E are an end view and a cross-sectional side view, respectively, of a rotating shaft assembly 450 configured to attach to both ends of tangential fan structure 400, in accordance with some embodiments. Bolt holes 454 on a concentric bolt circle, contain bolts (not shown) to secure rotating shaft assembly 450 to end flange 14 of the fan blade structure. An outer shaft diameter 460 is tapered stepwise to a concentric bearing shaft 462, configured to rotate within a shaft bearing (not shown).

As indicated in the '376 patent, the fan blade structure may also be produced using a cast process or a cart-and-welded process with touch-up machining.

The machined tangential fan blade structure is electropolished to achieve a surface finish of the order of 0.4 $\mu$m to 0.6 $\mu$m (15 microinch to 25 microinch) Ra on all surfaces, and is then electroless nickel coated.

Monolithic machined, cast, or cast-and-welded tangential fans, such as those described above also allow the shaping of airfoil blade members, which are difficult or impractical to produce using conventional stamping processes. Whereas conventional blade members 314 are substantially uniform in thickness, an airfoil blade member typically has a "teardrop" profile, including a rounded leading edge, a thickened midsection and a tapered trailing edge. Incorporation of airfoil blade members 320 is expected to improve the aerodynamic efficiency of tangential fans.

Significant stiffness against bending moments is provided by hub members 14, without which blade members 10 or 10A would be too flexible to be useful above approximately 100 rpm. Particularly, the monolithic tangential fan structure allows for precise control of the radiused connections from hub member to blade member and from end flange to blade member. This controlled fillet which adds stiffness, also results in higher bending mode frequencies and correspondingly higher permitted operating speeds, ranging as high as 5,000 or more rpm. The greater stiffness of monolithic machined tangential fan structure also increases the ability of such a tangential fan to resist "aerodynamic buffeting" effects within laser chamber.

In particular, embodiments of the invention provide for increasing fan stiffness by optimally selecting the number and longitudinal placement of hub members, such as hub members in the tangential fan structure. Investigations have shown that the natural frequency of the first bending vibration mode increases as the number of hub members increases. Severe vibrations of the tangential fan occur at rotation rates approximating one-half of the natural frequency of the first bending mode, because the fan structure distorts laterally at each half period of rotation. Whereas in structures typical of previous tangential fans, this limits rotation frequencies to less than a few hundred rpm, optimal selection of the number and longitudinal placement of hub members extends the range of rotation frequencies to 5,000 or more rpm. Therefore, increasing the natural frequency of the first bending mode by optimal selection of the number and longitudinal placement of hub members extends the range of rotation frequencies to 5,000 or more rpm. Therefore, increasing the natural frequency of the first bending mode by optimal selection of the number and longitudinal placement of hub members improves the performance of a tangential fan.

The surface and dimensional control of machined monolithic tangential fan 400 are more precise than those of a brazed or cast tangential fan. The monolithic machined tangential fan requires only a minimum of balancing and should impart a smoother flow of gas due to blade-to-blade uniformity.

While embodiments of the present invention have been shown and described, changes and modifications to these illustrative embodiments can be made without departing from the present invention in its broader aspects. Thus it should be evident that there are other embodiments of this invention which, while not expressly described above, are within the scope of the present invention. Therefore, it will be understood that the appended claims necessarily encompass all such changes and modifications as fall within the described invention's true scope; and further that this scope is not limited merely to the illustrative embodiments presented to demonstrate that scope.

We claim:

1. An electric discharge laser apparatus including a tangential fan comprising:
   A) a laser chamber comprising:
      1) a laser gas,
      2) at least two longitudinal electrodes for producing to electric discharges defining a discharge region in said gas,
      3) a tangential fan for circulating said laser gas said fan defining a rotation axis and a circumference corresponding to a blade diameter of at least 5 inches, substantially concentric with said rotation axis and comprising a monolithic fan blade structure, said structure comprising:
         a) a plurality of blade members, having non-uniform thickness and separated into at least 18 segments disposed in an approximate double helix pattern proximate to said circumference with the blade members in alternate segments being positioned approximately parallel to each other and at an acute angle with said rotation axis, said acute angle being approximately equal and opposite said acute angle of blade members in adjacent segments; and
         b) a plurality of at least 17 hub members supporting said blade members and defining fan blade segments;
      said blade members being positioned to minimize adverse effects in said discharge region of reflection of discharge generated acoustic shock waves from said blade members, and said blade members and said hub members being machined as a monolithic unit from a single block of material,
   B) a pulse power source for providing high voltage electrical pulses to said electrodes to produce electric discharges between said electrodes, at pulse rates of greater than 3,700 Hz, and
   C) one or more fan motors driving said fan at speeds of 3500 rpm or greater.

2. The apparatus of claim 1, wherein the number of said blade members within each of a plurality of said segments is an odd integer.

3. The apparatus of claim 1, wherein said blade member has an airfoil cross-sectional shape.

4. The apparatus of claim 1, wherein said hub members are disposed substantially transversely relative to said rotation axis, wherein the number and axial placement of said hub members are selected such that the natural frequency of bending mode vibration of said tangential fan is controlled.

5. The apparatus of claim 4, wherein said hub members art selected such that the natural frequency of bending mode vibration of said tangential fan is greater than twice the rotation frequency of said tangential fan.

6. The apparatus of claim 1, wherein the material of said tangential fan is an alloy selected front the group consisting of 6061 aluminum, an aluminum alloy containing additive metals consisting substantially of 3.5–6.5 percent copper and 0–2.5 per cent nickel, and an aluminum alloy containing additive metals consisting substantially of 3.5–6.5 percent copper and 0–1.5 percent silver.

7. An apparatus as in claim 1 wherein said blade members have a cross section corresponding to an arc of an circle.

8. An apparatus as in claim 7 wherein said circle is defined by a radius of less than 1.0 inch.

9. An apparatus as in claim 1 wherein said blades are positioned within each segment of a plurality of said segments in an asymmetrical manner.

10. An apparatus as in claim 1 wherein said blade members in each of a plurality of said segment are positioned in an asymmetrical manner relative to blades in adjacent segments.

11. An apparatus as in claim 1 wherein said blades within each segment are positioned so as to simulate a double helix configuration for the fan blade structure and the blades within each segment are also positioned in an asymmetrical manner.

12. An apparatus as in claim 11 wherein blades in each of plurality of said segments are positioned in an asymmetrical manner relative to blades in adjacent segments.

13. An apparatus as in claim 1 wherein said blade members have a cross section defined by a first circular arc with a first radius defining a convex blade member cylindrical surface and a second circular arc with a second radius defining a concave cylindrical surface.

14. An apparatus as in claim 13 wherein said first radius is larger than said second radius and each of the two radii have a common straight line origin.

15. An apparatus as in claim 13 wherein said second radius is larger than said first radius and said second radius has an origin farther away from said blade member than said corresponding origin of said first radius.

16. An apparatus as in claim 15 wherein said blade elements comprises two cylindrical surfaces and a pointed leading edge.

17. An apparatus as in claim 1 wherein all or substantially all of said blade members comprise two cylindrical surfaces and a pointed leading edge.

18. An electric discharge laser apparatus including a tangential fan comprising:
   A) a laser chamber comprising:
      1) a laser gas,
      2) at least two longitudinal electrodes configured to produce electric discharges defining a discharge region in said gas,
      3) a tangential fan for circulating said laser gas said fan defining a rotation axis and a circumference substantially concentric with said rotation axis and comprising a monolithic fan blade structure, said structure comprising:
         a) a plurality of blade members disposed proximate to said circumference; and
         b) a plurality of hub members supporting said blade members and defining fan blade segments;
         c) said blade members being positioned in adjacent fan blade segments in a double helix pattern with the blades in sequential fan blade segments of the same helix pattern randomized to nut be in helical alignment;
   B) a pulse power source for providing high voltage electrical pulses to said electrodes to produce electric discharges between said electrodes.

* * * * *

UNITED STATES PATENT AND TRADEMARK OFFICE
CERTIFICATE OF CORRECTION

PATENT NO. : 6,765,946 B2 Page 1 of 1
DATED : July 20, 2004
INVENTOR(S) : Partlo et al.

It is certified that error appears in the above-identified patent and that said Letters Patent is hereby corrected as shown below:

<u>Column 8,</u>
Line 61, change "nut" to -- not --.

Signed and Sealed this

Tenth Day of May, 2005

JON W. DUDAS
*Director of the United States Patent and Trademark Office*